(12) United States Patent
Chirania et al.

(10) Patent No.: US 7,378,869 B1
(45) Date of Patent: May 27, 2008

(54) LOOKUP TABLE CIRCUITS PROGRAMMABLE TO IMPLEMENT FLIP-FLOPS

(75) Inventors: Manoj Chirania, San Jose, CA (US); Martin L. Voogel, Los Altos, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 11/726,024

(22) Filed: Mar. 20, 2007

(51) Int. Cl.
*H03K 19/173* (2006.01)
*H03K 19/177* (2006.01)
*G06F 7/38* (2006.01)
*H01L 25/00* (2006.01)

(52) U.S. Cl. .......................... 326/38; 326/37; 326/41; 327/199; 327/203

(58) Field of Classification Search ............ 326/37–41, 326/47; 327/200–218
See application file for complete search history.

(56) References Cited

U.S. PATENT DOCUMENTS

| | | | |
|---|---|---|---|
| 6,956,399 B1 * | 10/2005 | Bauer ........................... | 326/41 |
| 6,998,872 B1 | 2/2006 | Chirani et al. | |
| 7,268,587 B1 * | 9/2007 | Pham et al. ................... | 326/41 |
| 7,276,934 B1 * | 10/2007 | Young .......................... | 326/38 |

OTHER PUBLICATIONS

Xilinx, Inc.; U.S. Appl. No. 11/151,892 by Young et al. filed Jun. 14, 2005.
Xilinx, Inc.; U.S. Appl. No. 11/726,040 by Chirania et al. filed Mar. 20, 2007.

* cited by examiner

*Primary Examiner*—Rexford Barnie
*Assistant Examiner*—Dylan White
(74) *Attorney, Agent, or Firm*—Lois D. Cartier

(57) ABSTRACT

A lookup table (LUT) is programmable to function as a flip-flop. The LUT includes a plurality of memory cells, a plurality of transmission gates, and first and second logic gates. The transmission gates are coupled between the memory cells and an output terminal of the LUT to form a multiplexer circuit selecting one of a plurality of values stored in the memory cells and providing the selected value to the output terminal. First and second logic gates are included in two of the paths through the multiplexer, also providing first and second feedback paths within the LUT. These feedback paths enable the programmable implementation of first and second latches that form the flip-flop. Another subset of the memory cells can be optionally used to implement a function that drives the data input of the flip-flop.

20 Claims, 11 Drawing Sheets

LOOKUP TABLE CIRCUITS PROGRAMMABLE TO IMPLEMENT FLIP-FLOPS

FIELD OF THE INVENTION

The invention relates to programmable integrated circuit devices (ICs). More particularly, the invention relates to circuits and methods of implementing flip-flops in programmable lookup tables.

BACKGROUND

Programmable logic devices (PLDs) are a well-known type of programmable IC that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

A CLB typically includes one or more lookup tables (LUTs) that can be programmed to implement logic functions, as well as one or more flip-flops for storing LUT output signals. FIG. 1 illustrates one such CLB. CLB 100 of FIG. 1 includes four similar slices SLICE_0-SLICE_3. Each slice includes two lookup tables (LUTs) 101 and 102, a write control circuit 105, two multiplexers MUX1 and MUX2, and two output memory elements 103 and 104. The lookup tables, write control circuit, multiplexers, and output memory elements are all controlled by configuration memory cells MC1-MC7. Note that at least some of configuration memory cells MC1-MC7 represent more than one memory cell. Additional configuration memory cells and logic elements are omitted from FIG. 1, for clarity.

Each LUT 101, 102 can function in any of several modes. When in lookup table mode, each LUT has four data input signals IN1-IN4 that are supplied by the FPGA interconnect structure (not shown) via input multiplexers (not shown). (In the present specification, the same reference characters are used to refer to terminals, signal lines, and their corresponding signals.) When in RAM mode, input data is supplied by an input terminal RAM_DI_1, RAM_DI_2 to the DI terminal of the associated LUT. RAM write operations in both LUTs are controlled by write control circuit 105, which supplies one or more write control signals W to both LUTs based on RAM control signals provided by the interconnect structure.

Each LUT 101, 102 provides a LUT output signal to an associated multiplexer MUX1, MUX2, which selects between the LUT output signal and an associated register direct input signal Reg_DI_1, Reg_DI_2 from the interconnect structure. Thus, each LUT can be optionally bypassed. The output of each multiplexer MUX1, MUX2 is provided to the data input terminal D of an associated output memory element (103, 104 respectively). Memory elements 103 and 104 are clocked by a clock signal CK (e.g., provided by a global clock network) and controlled by various other register control signals (e.g., from the interconnect structure or provided by configuration memory cells of the FPGA). Each memory element 103, 104 provides a registered output signal Q1, Q2. The output of each LUT 101, 102 is also provided to an output terminal OUT1, OUT2 of the CLE. Thus, each output memory element can be optionally bypassed. The slice also includes output multiplexers (not shown) that select from among the various output signals of the slice and provide the selected signals to the FPGA interconnect structure. These output multiplexers are also controlled by configuration memory cells (not shown).

A LUT is commonly implemented as a series of multiplexers controlled by configuration memory cells, e.g., as shown in FIG. 2. The LUT circuit illustrated in FIG. 2 can be used, for example, to implement LUTs 101, 102 of FIG. 1. Input signals IN1-IN4 control transmission gates 201 to select one from a series of values stored in configuration memory cells M0-M15. As is well known, a transmission gate can include one N-channel transistor and one P-channel transistor coupled in parallel, with the N- and P-channel transistors being gated by complementary input signals. (The complementary input signals driving transmission gates 201 are not illustrated in FIG. 2, for clarity, but are indicated by the insertion of a bubble above or below two paired triangles. A bubble above the transmission gate indicates a gate that is "on" when the pictured input signal is low, and "off" when the input signal is high. A bubble below the transmission gate indicates a gate that is "on" when the pictured input signal is high, and "off" when the input signal is low.) In the illustrated embodiment, inverters 211-214 and 221 are also included, to buffer the signals as they pass from the memory cells M0-M15 to the output terminal OUT.

Programmable ICs benefit from the ability to implement a wide variety of designs. Therefore, the ratio of combinational logic to flip-flops in a design is not always one-to-one, as in the CLB of FIG. 1. For example, some designs may consume a larger number of flip-flops than LUTs. In such cases, it is not uncommon for some of the LUTs to go unused because of the lack of available flip-flops. It is desirable to provide methods and circuits that allow programmable elements in a programmable IC to accommodate such variations.

SUMMARY

The invention provides circuits and methods of implementing flip-flops in the lookup tables (LUTs) of programmable integrated circuits.

According to a first aspect of the invention, a flip-flop is implemented by programming a dual-output LUT to include a first function implementing a master latch and a second function implementing a slave latch. An output of the master latch is provided at a first output terminal of the LUT, and an output of the slave latch is provided at a second output terminal of the LUT. The output of the master latch (the first output of the LUT) is coupled to a first input terminal of the LUT, where it drives both the first and second functions. The output of the slave latch (the second output of the LUT) is coupled to a second input terminal of the LUT, where it drives the second function. A clock signal is provided to both first and second functions via a third input terminal of the LUT.

According to a second aspect of the invention, a LUT having one or more outputs is programmable to function as a flip-flop. The LUT includes a plurality of memory cells, a plurality of transmission gates, and first and second logic gates. The transmission gates are coupled between the memory cells and an output terminal of the LUT to form a multiplexer circuit selecting one of a plurality of values stored in the memory cells and providing the selected value to the output terminal. The first logic gate is coupled between two transmission gates on a first path through the multiplexer circuit, and has an additional input terminal coupled to a third transmission gate also located on the first path. Thus, a feedback path is formed within the multiplexer circuit, enabling the programmable implementation of a first latch. The second logic gate is coupled between two transmission gates on a second path through the multiplexer circuit, and has an additional input terminal coupled to another transmission gate also located on the second path. Thus, a second feedback path is formed within the multiplexer circuit, enabling the programmable implementation of a second latch. The first and second latches form the desired flip-flop. Another subset of the memory cells can be used, if desired, to implement a function that drives the data input of the flip-flop.

BRIEF DESCRIPTION OF THE DRAWINGS

The present invention is illustrated by way of example, and not by way of limitation, in the following figures.

DETAILED DESCRIPTION OF THE DRAWINGS

The present invention is applicable to a variety of programmable integrated circuits (ICs) including lookup tables (LUTs). The present invention has been found to be particularly applicable and beneficial for programmable logic devices (PLDs) such as the exemplary field programmable gate arrays (FPGAs) described herein. However, the present invention is not limited by these examples, and can be applied to virtually any programmable IC that includes programmable lookup tables.

In the following description, numerous specific details are set forth to provide a more thorough understanding of the present invention. However, it will be apparent to one skilled in the art that the present invention can be practiced without these specific details. In other instances, well known features have not been described in detail, so as not to obscure the invention. For ease of illustration, the same numerical labels may be used in different diagrams to refer to the same items. However, in alternative embodiments the items may be different.

Figure 3:
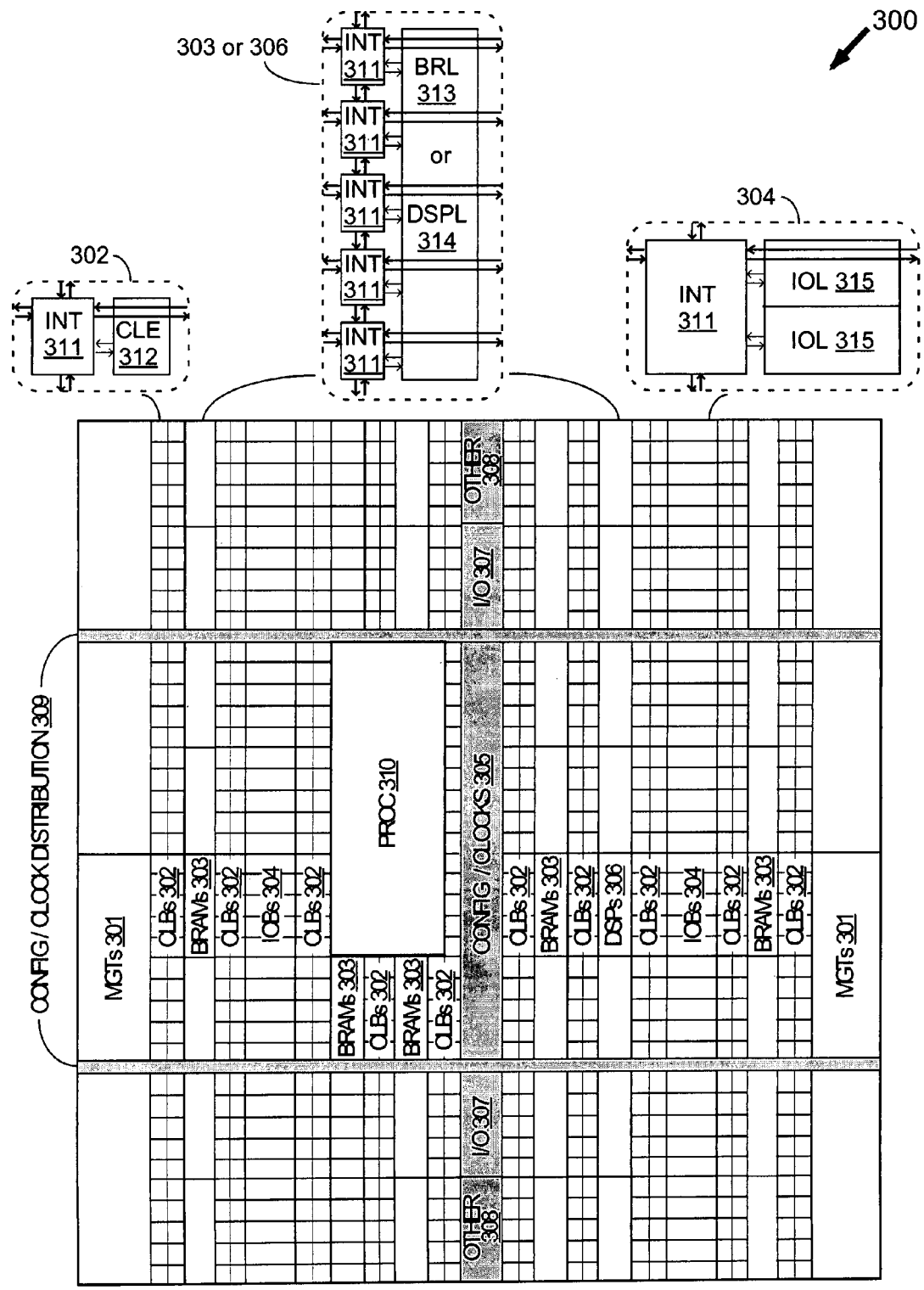
FIG. 3 illustrates an FPGA architecture that includes several different types of programmable logic blocks.

As noted above, advanced FPGAs can include several different types of programmable logic blocks in the array. For example, FIG. 3 illustrates an FPGA architecture 300 that includes a large number of different programmable tiles including multi-gigabit transceivers (MGTs 301), configurable logic blocks (CLBs 302), random access memory blocks (BRAMs 303), input/output blocks (IOBs 304), configuration and clocking logic (CONFIG/CLOCKS 305), digital signal processing blocks (DSPs 306), specialized input/output blocks (I/O 307) (e.g., configuration ports and clock ports), and other programmable logic 308 such as digital clock managers, analog-to-digital converters, system monitoring logic, and so forth. Some FPGAs also include dedicated processor blocks (PROC 310).

In some FPGAs, each programmable tile includes a programmable interconnect element (INT 311) having standardized connections to and from a corresponding interconnect element in each adjacent tile. Therefore, the programmable interconnect elements taken together implement the programmable interconnect structure for the illustrated FPGA. The programmable interconnect element (INT 311) also includes the connections to and from the programmable logic element within the same tile, as shown by the examples included at the top of FIG. 3.

For example, a CLB 302 can include a configurable logic element (CLE 312) that can be programmed to implement user logic plus a single programmable interconnect element (INT 311). A BRAM 303 can include a BRAM logic element (BRL 313) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 306 can include a DSP logic element (DSPL 314) in addition to an appropriate number of programmable interconnect elements. An IOB 304 can include, for example, two instances of an input/output logic element (IOL 315) in addition to one instance of the programmable interconnect element (INT 311). As will be clear to those of skill in the art, the actual I/O pads connected, for example, to the I/O logic element 315 typically are not confined to the area of the input/output logic element 315.

In the pictured embodiment, a columnar area near the center of the die (shown shaded in FIG. 3) is used for configuration, clock, and other control logic. Horizontal areas 309 extending from this column are used to distribute the clocks and configuration signals across the breadth of the FPGA.

Some FPGAs utilizing the architecture illustrated in FIG. 3 include additional logic blocks that disrupt the regular columnar structure making up a large part of the FPGA. The additional logic blocks can be programmable blocks and/or dedicated logic. For example, the processor block PROC 310 shown in FIG. 3 spans several columns of CLBs and BRAMs.

Note that FIG. 3 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 3 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 4:
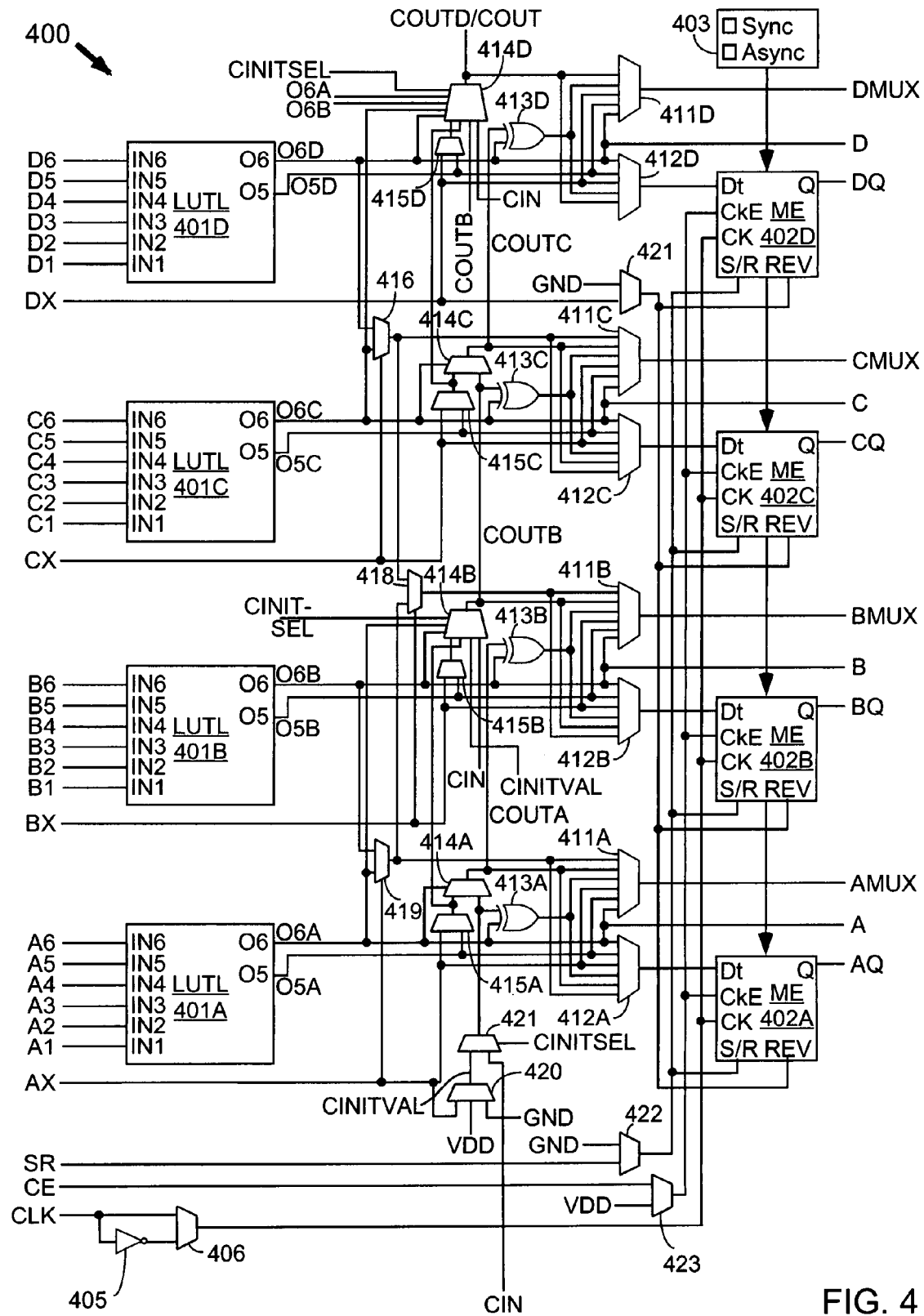
FIG. 4 illustrates a portion of a configurable logic element (CLE) of the FPGA of FIG. 3.

FIG. 4 illustrates a portion of a configurable logic element (CLE) of the FPGA of FIG. 3. A CLE in this FPGA includes two slices, with each slice being implemented in a manner similar to that shown in FIG. 4. In this CLE, the lookup tables (LUTs) are not 4-input LUTs, but 6-input LUTs.

In the embodiment of FIG. 4, slice 400 includes four LUTs 401A-401D, each driven by six LUT data input terminals A1-A6, B1-B6, C1-C6, and D1-D6 and each providing two LUT output signals O5 and O6. The O6 output terminals from LUTs 401A-401D drive slice output terminals A-D, respectively. The LUT data input signals are supplied by the FPGA interconnect structure (not shown in FIG. 4) via input multiplexers (not shown in FIG. 4), and the LUT output signals are also supplied to the interconnect structure. Slice 400 also includes: output select multiplexers 411A-411D driving output terminals AMUX-DMUX; multiplexers 412A-412D driving the data input terminals of memory elements 402A-402D; combinational multiplexers 416, 418, and 419; bounce multiplexer circuits 422-423; a circuit represented by inverter 405 and multiplexer 406 (which together provide an optional inversion on the input clock path); and carry logic comprising multiplexers 414A-414D, 415A-415D, 420-421 and exclusive OR gates 413A-413D. All of these elements are coupled together as shown in FIG. 4. Where select inputs are not shown for the multiplexers illustrated in FIG. 4, the select inputs are controlled by configuration memory cells. These configuration memory cells, which are well known, are omitted from FIG. 4 for clarity.

In the pictured embodiment, each memory element 402A-402D can be programmed to function as a synchronous or asynchronous flip-flop or latch. The selection between synchronous and asynchronous functionality is made for all four memory elements in a slice by programming Sync/Asynch selection circuit 403. When a memory element is programmed so that the S/R (set/reset) input signal provides a set function, the REV input terminal provides the reset function. When the memory element is programmed so that the S/R input signal provides a reset function, the REV input terminal provides the set function. Memory elements 402A-402D are clocked by a clock signal CK, e.g., provided by a global clock network or by the interconnect structure. Such programmable memory elements are well known in the art of FPGA design. Each memory element 402A-402D provides a registered output signal AQ-DQ to the interconnect structure.

Each LUT 401A-401D provides two output signals, O5 and O6. The LUT can be configured to function as two 5-input LUTs with five shared input signals (IN1-IN5), or as one 6-input LUT having input signals IN1-IN6. Each LUT 401A-401D can be implemented, for example, as shown in FIG. 5.

Figure 5:
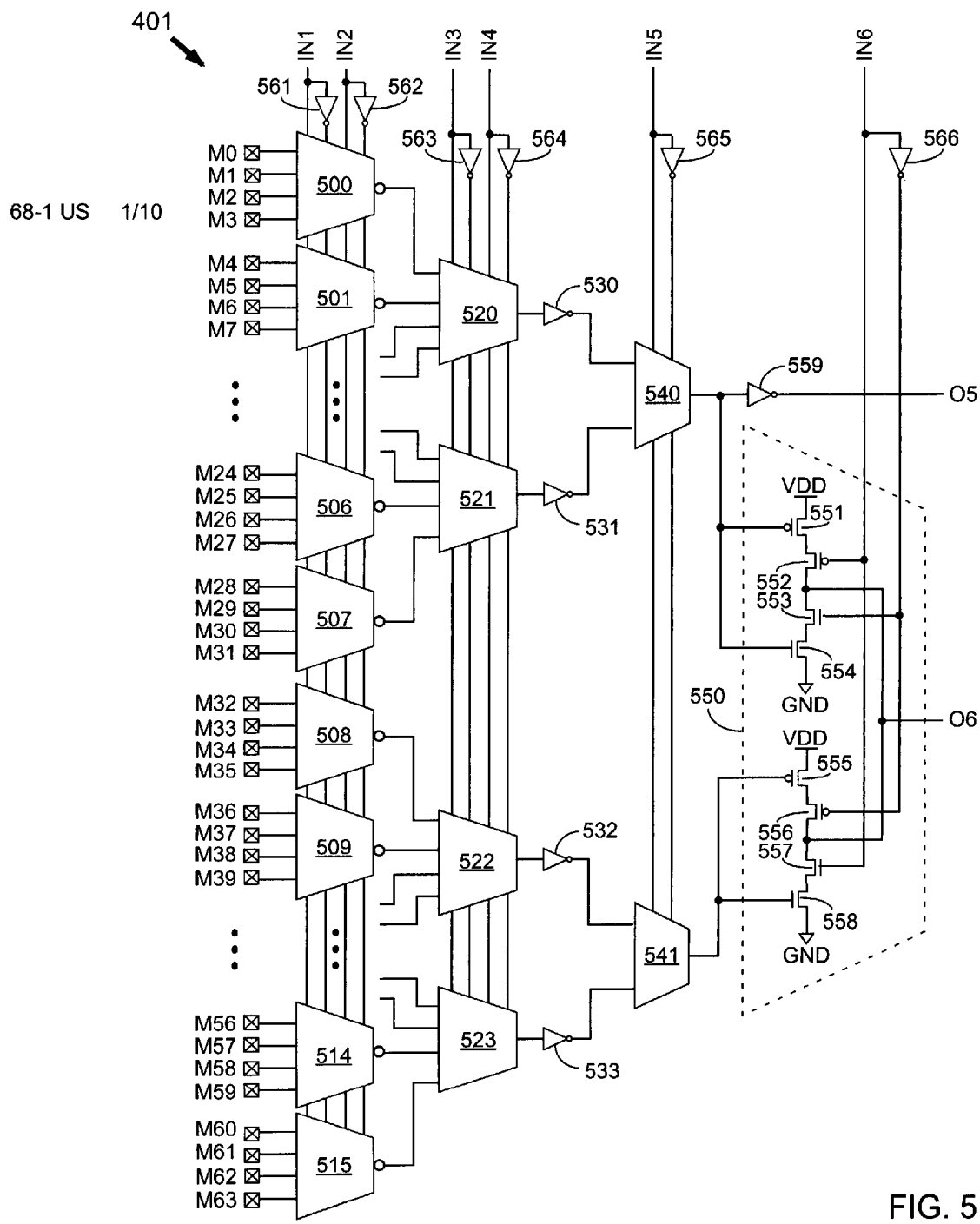
FIG. 5 illustrates a 6-input LUT included in the CLE of FIG. 4.

In the embodiment of FIG. 5, configuration memory cells M0-M63 drive 4-to-1 multiplexers 500-515, which are controlled by input signals IN1, IN2 and their inverted counterparts (provided by inverters 561, 562) to select 16 of the signals from the configuration memory cells. The selected 16 signals drive four 4-to-1 multiplexers 520-523, which are controlled by input signals IN3, IN4 and their inverted counterparts (provided by inverters 563, 564) to select four of the signals to drive inverters 530-533. Inverters 530-533 drive 2-to-1 multiplexers 540-541, which are controlled by input signal IN5 and its inverted counterpart (provided by inverter 565). The output of multiplexer 540 is inverted by inverter 559 and provides output signal O5. Thus, output signal O5 can provide any function of up to five input signals, IN1-IN5. Inverters can be inserted wherever desired in the multiplexer structure, with an additional inversion being nullified by simply storing inverted data in the configuration memory cells M0-M63. For example, the embodiment of FIG. 5 shows bubbles on the output terminals of multiplexers 500-515, which signifies an inversion (e.g., an inverter) on the output of each of these multiplexers.

Multiplexers 540 and 541 both drive data input terminals of multiplexer 550, which is controlled by input signal IN6 and its inverted counterpart (provided by inverter 566) to select either of the two signals from multiplexers 540-541 to drive output terminal O6. Thus, output signal O6 can either provide any function of up to five input signals IN1-IN5 (when multiplexer 550 selects the output of multiplexer 541, i.e., when signal IN6 is high), or any function of up to six input signals IN1-IN6.

In the pictured embodiment, multiplexer 550 is implemented as two three-state buffers, where one buffer is driving and the other buffer is disabled at all times. The first buffer includes transistors 551-554, and the second buffer includes transistors 555-558, coupled together as shown in FIG. 5.

Figure 1:
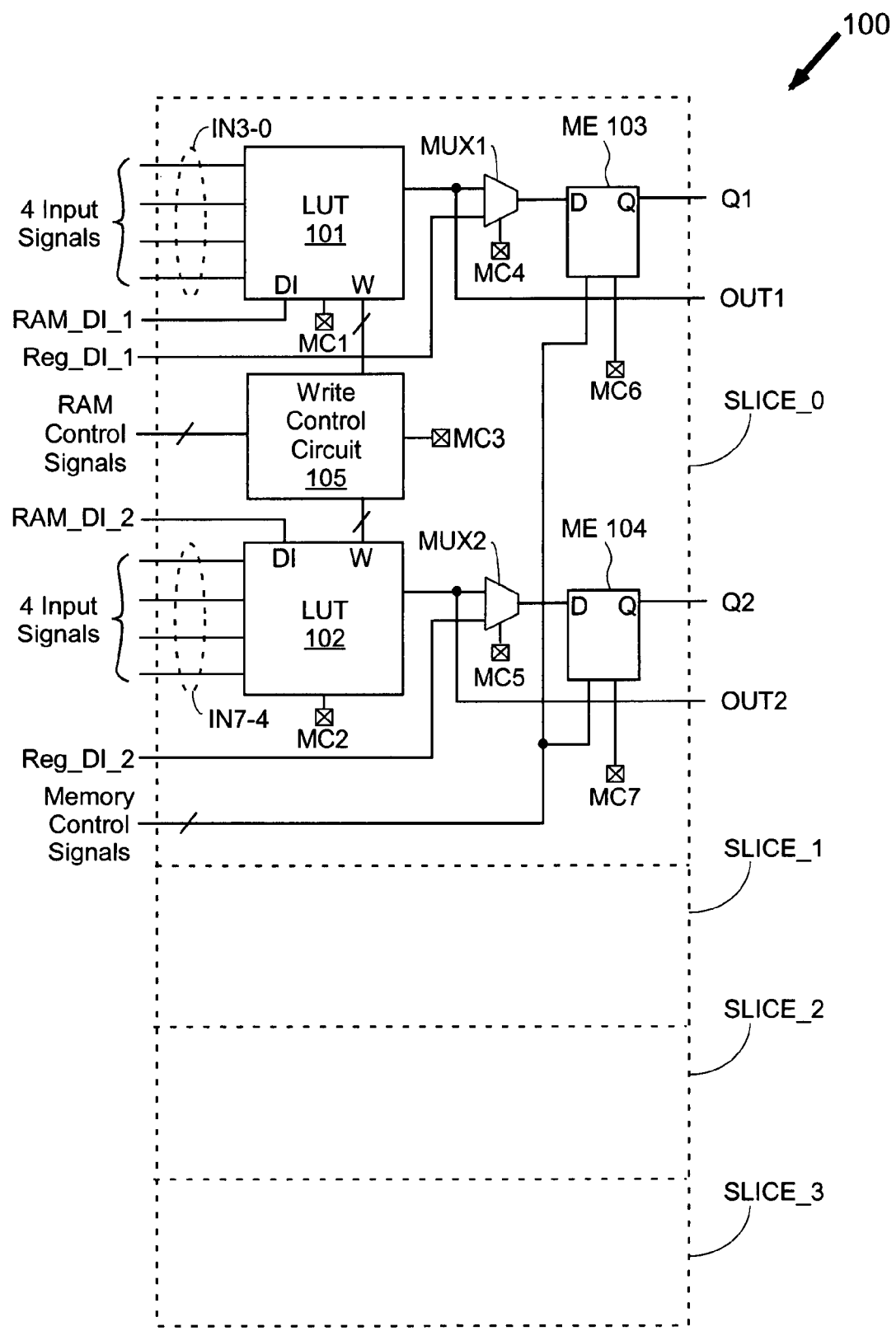
FIG. 1 illustrates a configurable logic block (CLB) of a known PLD.

The number of LUTs and flip-flops in a CLE is fixed at the time of manufacture of the programmable IC. Therefore, for example, the CLE shown in FIG. 1 includes eight 4-input LUTs and eight flip-flops. A CLE made up of two slices such as the slice of FIG. 4 includes eight 6-input LUTs and eight flip-flops. Clearly, more logic can be implemented in a 6-input LUT than in a 4-input LUT. Therefore, more combinational logic can be included in the CLE with 6-input LUTs than with 4-input LUTs, but the number of available flip-flops is unchanged. Even with 4-input LUTs, there can be a shortage of memory elements when implementing some designs. This lack becomes more acute when 6-input LUTs are used. Therefore, a method has been developed of programming the 6-input LUT of FIG. 5 to implement a flip-flop.

Figure 6:
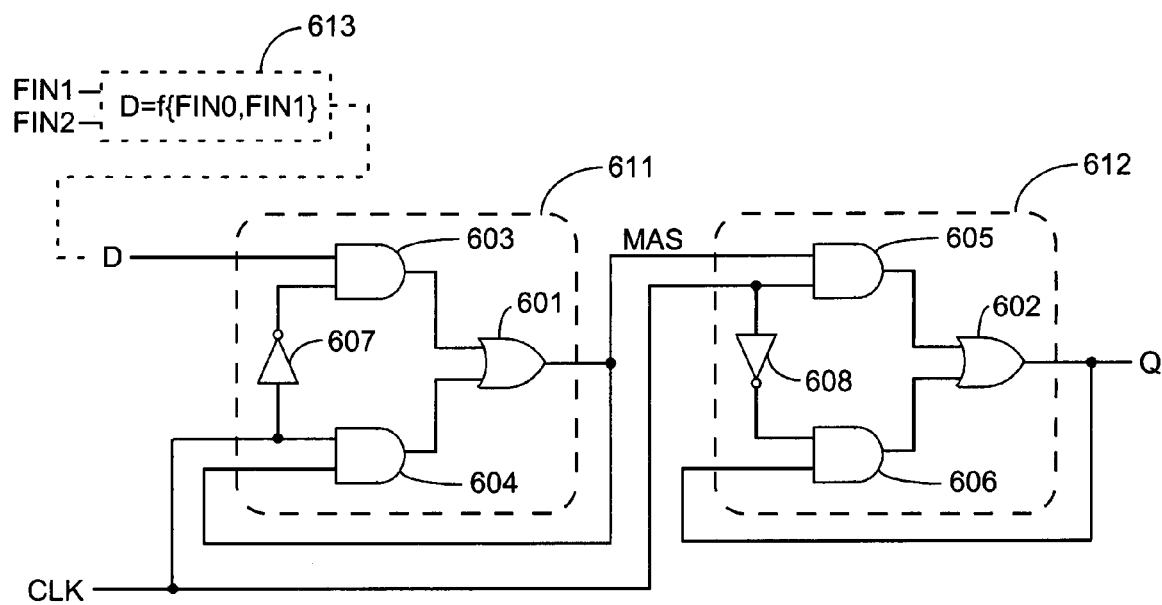
FIG. 6 illustrates a circuit implementing a D-type flip-flop.

FIG. 6 illustrates one circuit implementation of a D-type flip-flop that is suited to implementation in the 6-input LUT of FIG. 5. The flip-flop of FIG. 6 includes two latches: a master latch 611 and a slave latch 612. Both latches are clocked by a clock signal CLK. Master latch 611 includes AND gates 603, 604, OR gate 601, and inverter 607, coupled together as shown in FIG. 6. The data input signal D may be provided to directly to the master latch, or may be derived, for example, from two function input signals FIN1, FIN2, e.g., using function generator 613. Function generator 613 can be used, for example, to implement a synchronous set, reset, or clock enable function. The output signal MAS of the master latch drives the data input of the slave latch. Slave latch 612 includes AND gates 605, 606, OR gate 602, and inverter 608, coupled together as shown in FIG. 6. The output signal Q of the slave latch provides the output signal of the flip-flop.

Figure 7:
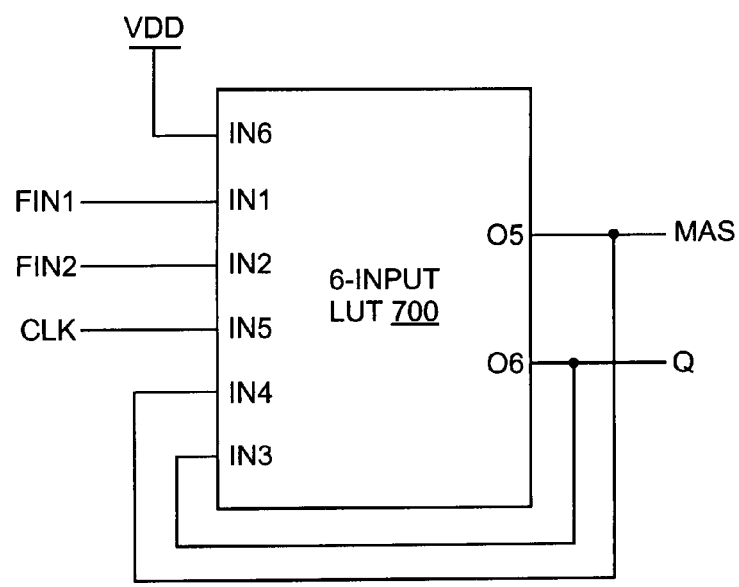
FIG. 7 illustrates how the 6-input LUT of FIG. 5 can be used to implement a the flip-flop of FIG. 6, according to one embodiment.

FIG. 7 illustrates how the 6-input LUT of FIG. 5 can be used to implement a the flip-flop of FIG. 6, according to one embodiment. As noted above, in dual output mode each of output signals O5, O6 can provide functions of up to five input signals, IN1-IN5. Master latch 611 and optional function generator 613 can both be implemented as a first 4-input function. The four inputs are FIN1, FIN2, CLK, and MAS, which can be placed, for example, on the IN1, IN2, IN5, and IN4 input terminals of the LUT (see FIG. 5), and the output signal MAS is provided on the first output terminal O5 of the LUT. Alternatively, function generator 613 can be omitted, and master latch 611 can be implemented as a 3-input function with inputs D, CLK, and MAS. Slave latch 612 can be implemented as a 3-input function. The three inputs are MAS, CLK, and Q, which can be placed, for example, on the IN4, IN5, and IN3 input terminals of the LUT, and the output signal Q of the slave latch is provided on the second output terminal O6 of the LUT. Clearly, different input terminals can be used for the LUT input signals, if desired.

In the pictured embodiment, the IN6 input terminal is tied to power high VDD to enable dual-output operation of the LUT. The output MAS of the master latch is fed back from the first output terminal O5 to the IN4 input terminal of the LUT. The output Q of the slave latch is fed back from the second output terminal O6 to the IN3 input terminal of the LUT. These feedback paths can be implemented, for example, using the programmable interconnect structure of the FPGA.

Figure 8:
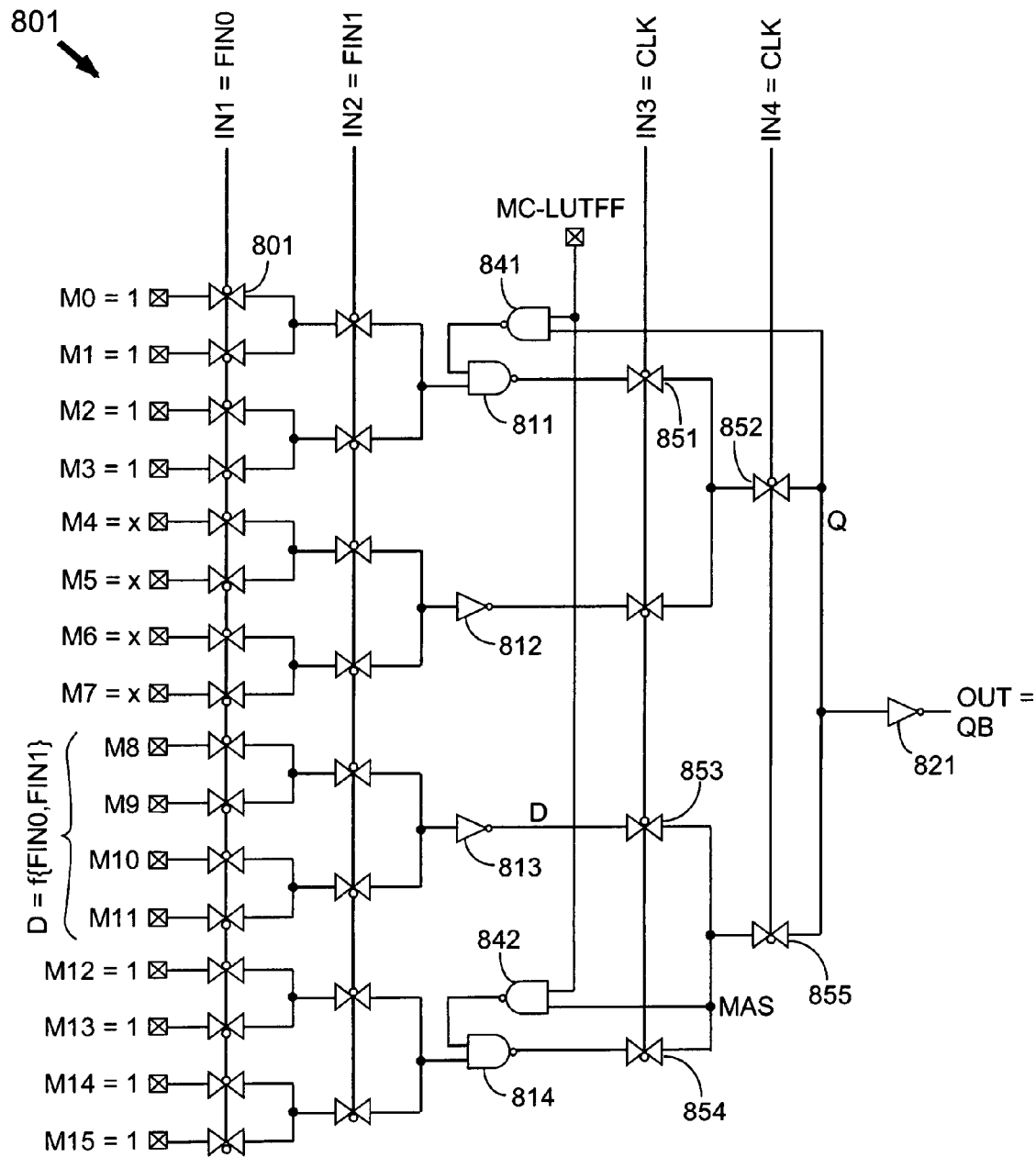
FIG. 8 illustrates a 4-input LUT that can be used to implement a flip-flop, according to another embodiment.

The external feedback paths shown in FIG. 7 can optionally be eliminated by modifying the circuitry of the LUT, as shown, for example, in FIG. 8. Another benefit of this modification is that a flip-flop can be implemented in a LUT having only one output terminal. For example, FIG. 8 illustrates how programmable feedback paths can be provided within a single-output 4-input LUT to enable the implementation of a D-type flip-flop including master and slave latches.

Figure 2:
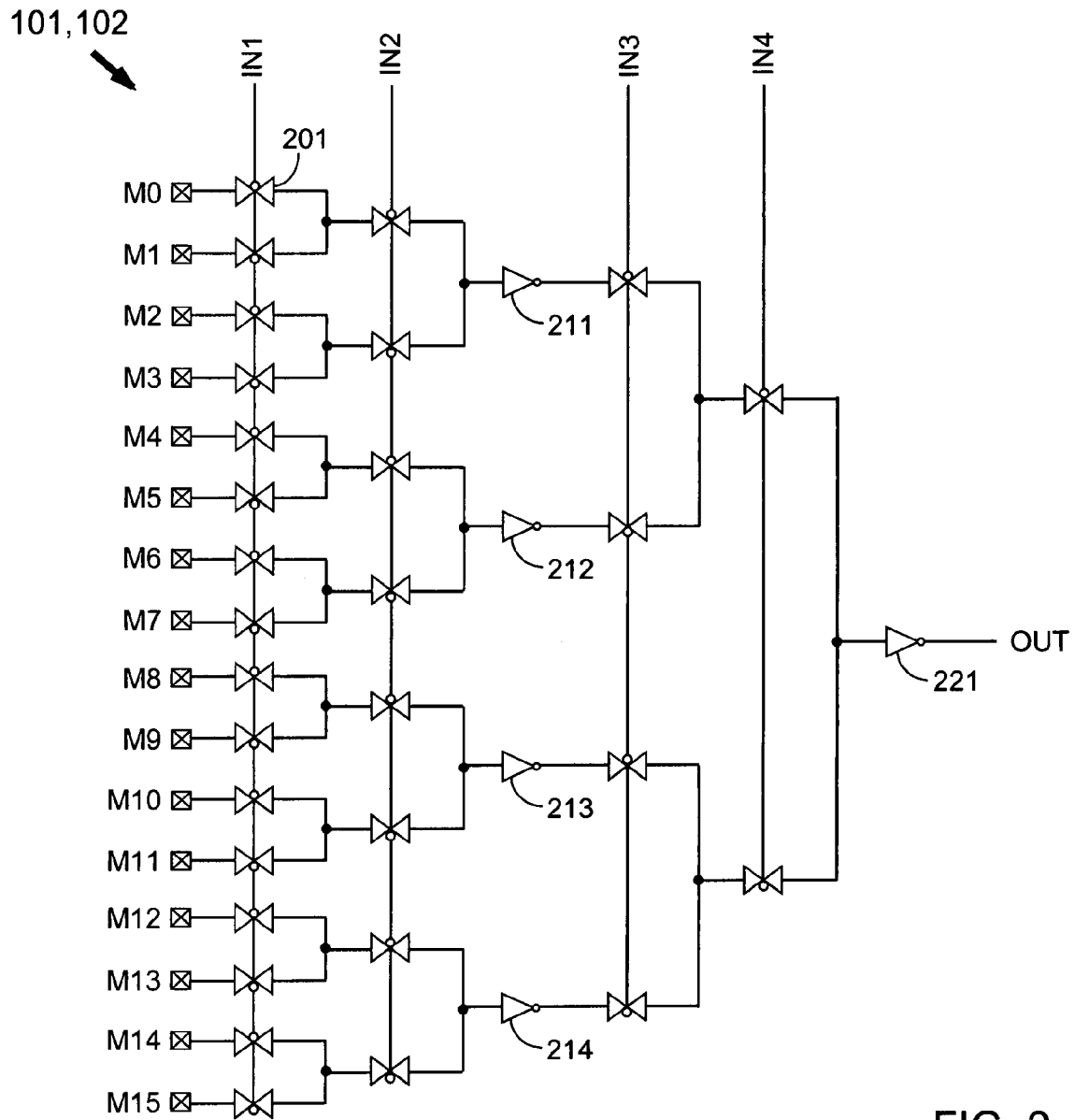
FIG. 2 illustrates a 4-input lookup table (LUT) implementation commonly used in known PLDs.

The 4-input LUT 801 of FIG. 8 resembles the 4-input LUT of FIG. 2. Input signals IN1-IN4 control transmission gates 801 to select one from a series of values stored in configuration memory cells M0-M15. Inverting logic gates 811-814 and 821 buffer the signals as they pass from the memory cells to the output terminal OUT. However, the LUT of FIG. 8 also includes a first feedback path from the node labeled "MAS" in FIG. 8, and back to logic gate 814. Thus, logic gate 814 is a NAND gate rather than an inverter as in the LUT of FIG. 2. Also included on the first feedback path is a 2-input NAND gate 842. Thus, NAND gates 814 and 842 form a latch controlled by a value stored in an additional configuration memory cell MC-LUTFF.

The second latch is provided in similar fashion using a second feedback path from the node prior to inverter 821 (labeled "Q" in FIG. 8), and back to logic gate 811. Thus, logic gate 811 is a NAND gate rather than an inverter as in the LUT of FIG. 2. Also included on the second feedback path is a 2-input NAND gate 841. Thus, NAND gates 811 and 841 form a latch controlled by the value stored in memory cell MC-LUTFF. As will be clear to those of skill in the art, this latch can also be formed in other ways. For example, NAND gates 842 and 841 could each be replaced by an inverter and a transmission gate coupled in series, with the transmission gate controlled by the value stored in memory cell MC-LUTFF.

In the pictured embodiment, a high value or logic "1" is stored in memory cells M0-M3 and M12-M15. The values stored in memory cells M4-M7 do not matter (the label "x" denotes a "don't care" value), because these memory cells are not selected by the circuit. Memory cells M8-M11 can optionally be used to store a 2-input function, e.g., function 613 shown in FIG. 6. A value from these memory cells is selected by function input signals FIN0, FIN1 provided on LUT input terminals IN1, IN2, respectively. Input signal CLK is provided on input terminals IN3 and IN4. In the pictured embodiment, the output signal OUT is the inverted flip-flop output signal, QB. It will be clear to those of skill in the art that the Q signal can be additionally or alternatively provided in other embodiments. Further, the value of output signal Q can be inverted simply by changing the contents of the memory cells, so that a value of DB (the inverse of data input signal D) is stored in the flip-flop.

LUT 801 can be used as a standard 4-input LUT by placing a first value (e.g., a low value) into memory cell MC-LUTFF to turn off the feedback paths. When memory cell MC-LUTFF is programmed to pass a low value to NAND gates 841, 842, NAND gates 841, 842 provide high values to NAND gates 814, 811, respectively, and the 4-input LUT of FIG. 8 functions in the same manner as the 4-input LUT of FIG. 2.

Figure 9:
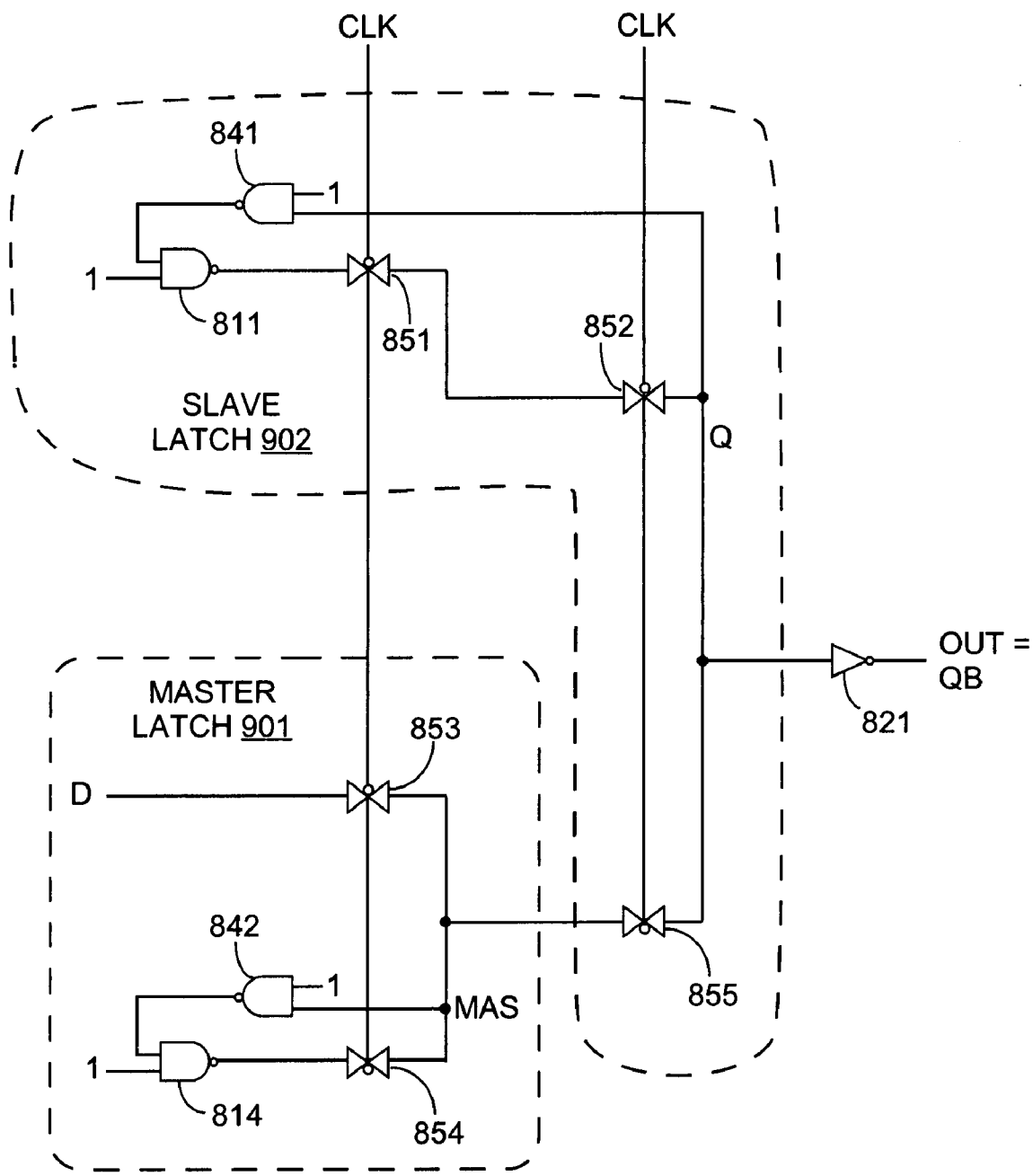
FIG. 9 illustrates the flip-flop circuit implemented in the 4-input LUT of FIG. 8.

When a second value (e.g., a high value) is placed into memory cell MC-LUTFF, the LUT functions as a flip-flop, as shown in FIG. 9. NAND gates 841 and 842, both function as inverters. NAND gate 842 enables a first latch, which forms the master latch 901 of the flip-flop. The master latch includes NAND gate 842, NAND gate 814 (which functions as a second inverter because the second input is a high value), and transmission gates 853, 854. NAND gate 841 enables a second latch, which forms the slave latch 902 of the flip-flop. The slave latch includes NAND gate 841, NAND gate 811 (which functions as a second inverter because the second input is a high value), and transmission gates 851, 852, 855. Note that transmission gates 851, 852 are both clocked by the same clock signal having the same sense, so they function together as a single transmission gate.

When clock signal CLK is low, the master latch is open (transmission gate 853 is on, and transmission gate 854 is off), and the slave latch is closed (transmission gate 855 is off, and transmission gates 851, 852 are both on). A new value is written from node D to the master latch, while the value stored in the slave latch is passed to the output QB (inverted by inverter 821). When clock signal CLK is high, the master latch is closed (transmission gate 853 is off and transmission gate 854 is on), and the slave latch is open (transmission gate 855 is on and transmission gates 851, 852 are both off). The value from node D is latched in the master latch, while the value MAS from the master latch is passed through transmission gate 855 to the slave latch and to the output QB (inverted by inverter 821).

In some embodiments (not shown), NAND gates 841, 842 are replaced by other inverting logic gates, such as inverters and/or NOR gates. In other embodiments (not shown) implementing 5-input LUTs, the fifth input signal can be used to drive the NAND and/or NOR gates in the feedback paths to provide an asynchronous set and/or reset function. These and other architectural variations will be clear to those of skill in the art upon perusal of the present specification and drawings.

Figure 10:
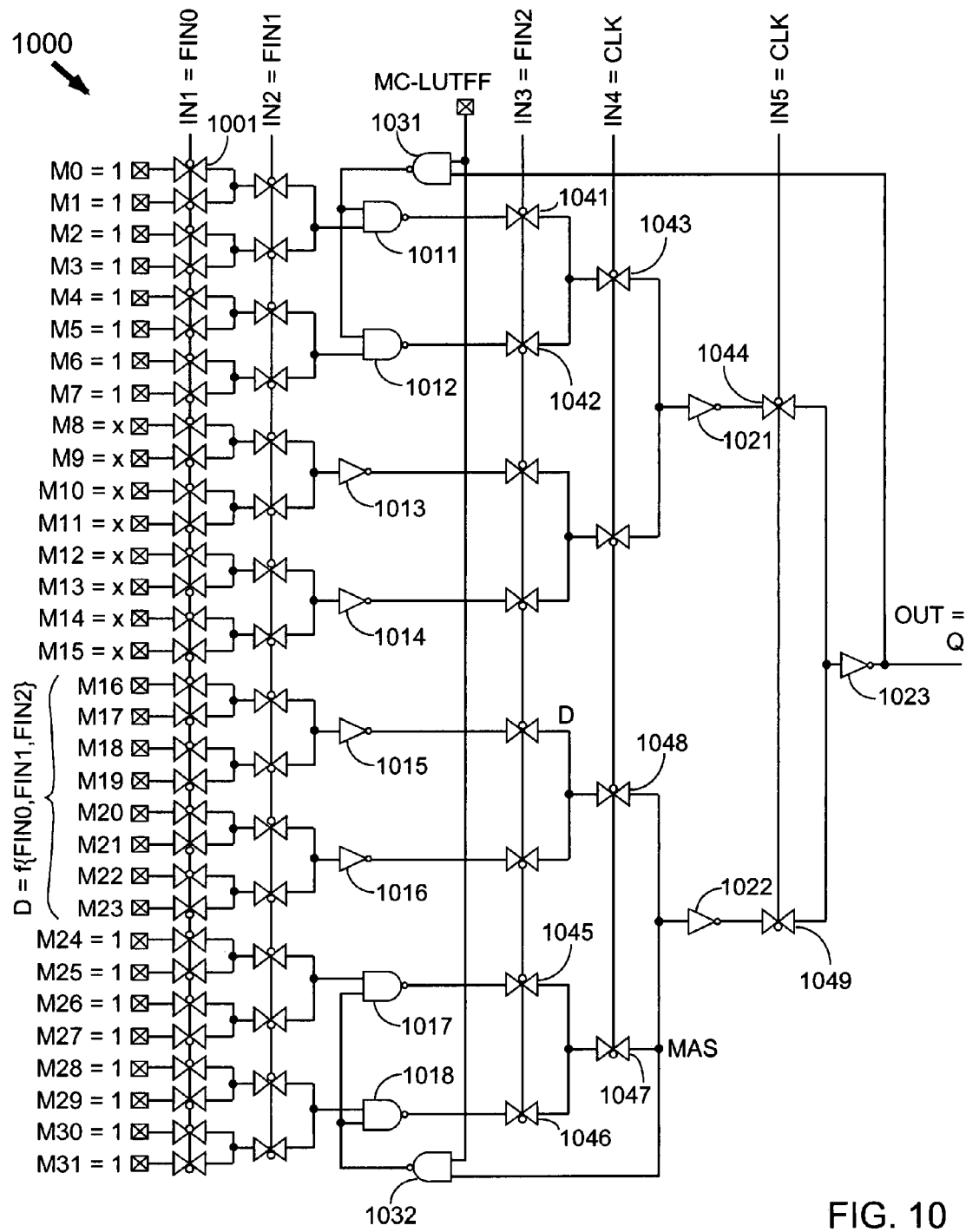
FIG. 10 illustrates a 5-input LUT that can be used to implement a flip-flop, according to another embodiment.

FIG. 10 shows how a 5-input LUT 1000 can be configured to implement a D-type flip-flop, in a similar fashion to the 4-input LUT of FIG. 8. Input signals IN1-IN5 control transmission gates 1001 to select one from a series of values stored in configuration memory cells M0-M31. Inverting logic gates 1011-1018 and 1021-1023 buffer the signals as they pass from the memory cells to the output terminal OUT.

LUT 1000 also includes a first feedback path from the node labeled "MAS" in FIG. 10, and back to logic gates 1017, 1018. Thus, logic gates 1017, 1018 are NAND gates rather than inverters as in previously-known 5-input LUTs. Note that one of transmission gates 1045 and 1046 is on at all times, regardless of the value of signal FIN2 on input IN3, so one of NAND gates 1017, 1018 provides the inversion function at all times. The first feedback path includes NAND gate 1032. Thus NAND gates 1017, 1018, and 1032 form a latch controlled by a value stored in an additional configuration memory cell MC-LUTFF.

The second latch is provided in similar fashion using a second feedback path from the output node OUT (labeled "Q" in FIG. 10), and back to logic gates 1011, 1012. The second input to each of NAND gates 1011, 1012 is a high value. Therefore, these two gates together function as a single inverter. One of transmission gates 1041 and 1042 is on at all times, regardless of the value of signal FIN2 on input IN3, so one of NAND gates 1011, 1012 provides the inversion function at all times. Also included on the second feedback path is a NAND gate 1031. Thus, inverters 1021, 1023 and NAND gates 1011, 1012, 1031 form a latch controlled by the value stored in memory cell MC-LUTFF.

In the pictured embodiment, a high value is stored in memory cells M0-M7 and M24-M31. The values stored in memory cells M8-M15 do not matter, because these memory cells are not selected by the circuit. Memory cells M16-M23 can optionally be used to store a 3-input function, e.g., a synchronous set, reset, or clock enable function. A value from these memory cells is selected by function input signals FIN0, FIN1, FIN2 provided on LUT input terminals IN1, IN2, IN3, respectively. Input signal CLK is provided in input terminals IN4 and IN5. In the pictured embodiment, the output signal OUT is the flip-flop output signal, Q. It will be clear to those of skill in the art that the inverted flip-flop signal QB can be additionally or alternatively provided in other embodiments.

LUT 1000 can be used as a standard 5-input LUT by placing a first value (e.g., a low value) into memory cell MC-LUTFF to turn off the feedback paths. When memory cell MC-LUTFF is programmed to pass a low value to NAND gates 1031, 1032, NAND gates 1031, 1032 provide high values to NAND gates 1011-1012 and 1017-1018, respectively, and the 5-input LUT of FIG. 10 functions in the same manner as a known 5-input LUT.

Figure 11:
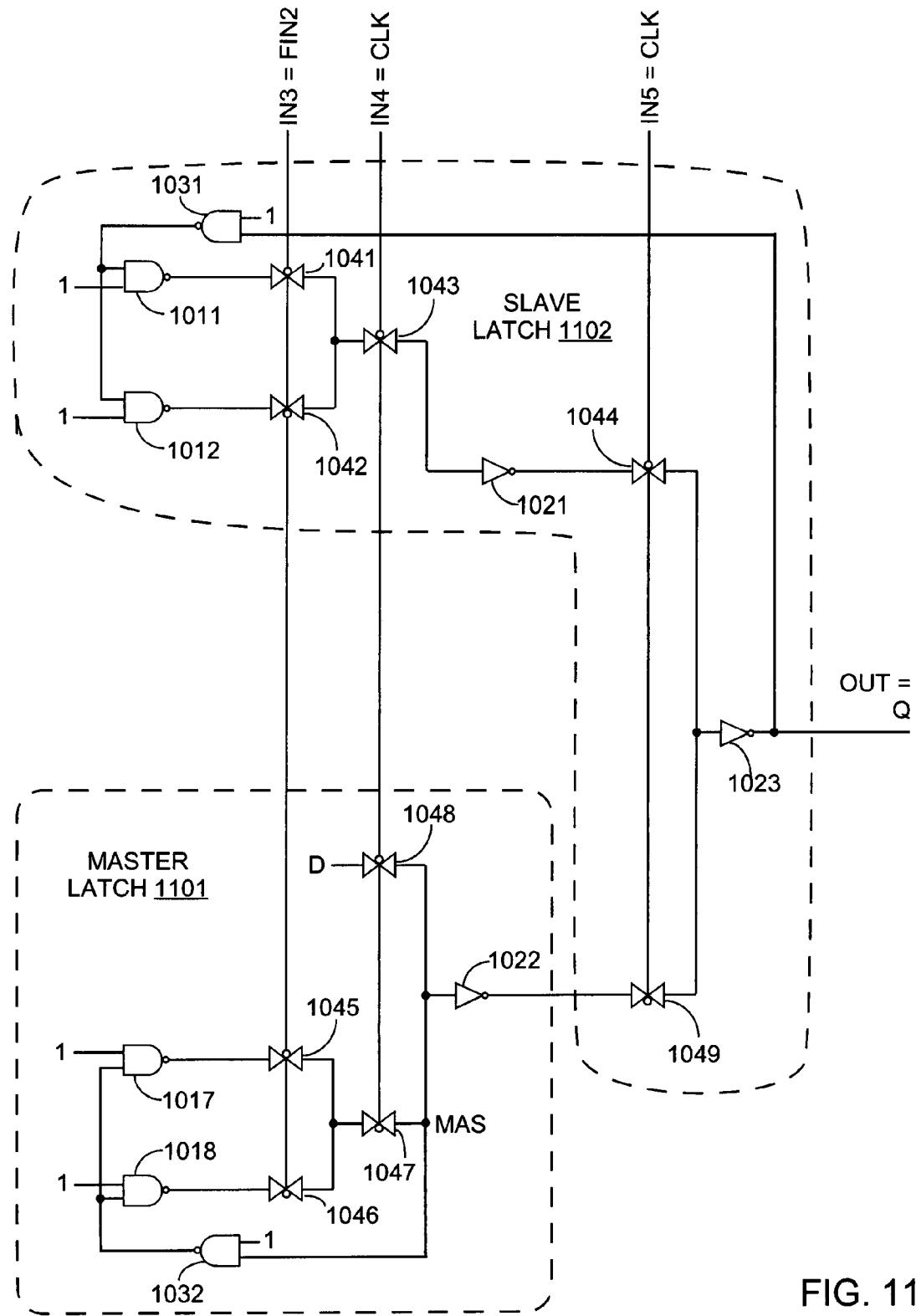
FIG. 11 illustrates the flip-flop circuit implemented in the 5-input LUT of FIG. 10.

When a second value (e.g., a high value) is placed into memory cell MC-LUTFF, the LUT functions as a flip-flop, as shown in FIG. 11. NAND gates 1031 and 1032 both function as inverters. NAND gate 1032 enables a first latch, which forms the master latch 1101 of the flip-flop. The master latch includes NAND gate 1032, NAND gates 1017, 1018 (which function as a second inverter because the second input of each NAND gate is a high value and one of transmission gates 1045, 1046 is on), and transmission gates 1047, 1048. The output of the master latch is inverted by inverter 1022. NAND gate 1031 enables a second latch, which forms the slave latch 1102 of the flip-flop. The slave latch includes NAND gate 1031, NAND gates 1011, 1012 (which function as a second inverter because the second input of each NAND gate is a high value and one of transmission gates 1041, 1042 is on), inverters 1021, 1023, and transmission gates 1043, 1044, 1049. Transmission gates 1043, 1044 are both clocked by the same clock signal having the same sense, so they function together as a single transmission gate.

When clock signal CLK is low, the master latch is open (transmission gate 1048 is on, and transmission gate 1047 is off), and the slave latch is closed (transmission gate 1049 is off, and transmission gates 1043, 1044 are both on). A new value is written from node D to the master latch, while the value stored in the slave latch is passed to the output Q (inverted by inverter 1023). When clock signal CLK is high, the master latch is closed (transmission gate 1048 is off and transmission gate 1047 is on), and the slave latch is open (transmission gate 1049 is on and transmission gates 1043, 1044 are both off). The value from node D is latched in the master latch, while the value from the master latch is passed through transmission gate 1049 to the slave latch and to the output Q (inverted by inverter 1023).

Figure 12:
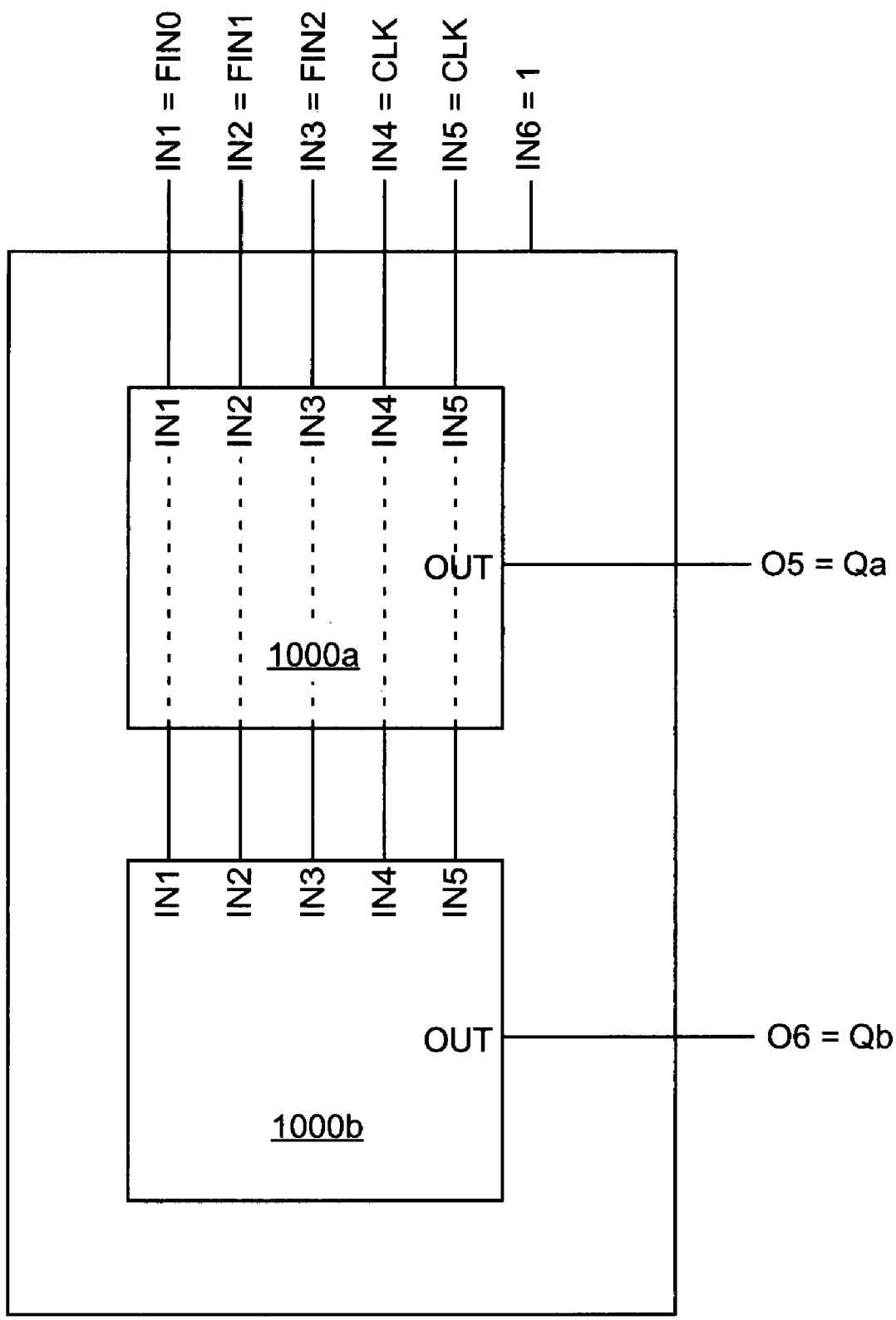
FIG. 12 illustrates how a 6-input LUT can be used to implement two flip-flops, according to another embodiment.

FIG. 12 illustrates how a 6-input LUT can be used to implement two flip-flops, according to another embodiment. The 6-input LUT of FIG. 5 can be modified, for example, to include four feedback paths that can be used to form two flip-flops, in a fashion similar to that shown in FIG. 10. In the embodiment of FIG. 12, first and second flip-flops are implemented in the two halves 1000a, 1000b of a 6-input LUT. The IN1-IN3 inputs shared by the two halves are used to provide function input signals FIN0-FIN2. The IN4 and IN5 input signals are driven by the flip-flop input signal CLK, as shown in FIG. 10. The IN6 input is tied to power high VDD (a logical one) to select dual-output mode for the 6-input LUT. The two flip-flop output signals Qa and Qb are provided on the O5 and O6 output terminals of the LUT.

Those having skill in the relevant arts of the invention will now perceive various modifications and additions that can be made as a result of the disclosure herein. For example, N-channel transistors, P-channel transistors, or some N-channel and some P-channel transistors can be used as transmission gates instead of using paired N- and P-channel transistors as in the embodiments illustrated herein. For example, various types of bidirectional gated elements can be used to implement transmission gates 855 of FIGS. 8 and 1049 of FIG. 10. Therefore, the term "transmission gate" as used herein is not intended to be construed as being limited to paired N- and P-channel transistors.

Further, transmission gates, transistors, multiplexers, inverters, NAND gates, logic gates, memory cells, flip-flops, lookup tables, configurable logic blocks, configurable logic elements, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A lookup table (LUT) programmable to function as a flip-flop, the LUT comprising:
   a plurality of memory cells;
   an output terminal;
   a plurality of transmission gates coupled between the memory cells and the output terminal to form a multiplexer circuit selecting one of a plurality of values stored in the memory cells and providing the selected value to the output terminal;
   a first logic gate coupled between first and second ones of the transmission gates on a first path through the multiplexer circuit, the first logic gate further having an input terminal coupled to a third transmission gate also located on the first path; and
   a second logic gate coupled between fourth and fifth ones of the transmission gates on a second path through the multiplexer circuit, the second logic gate further having an input terminal coupled to a sixth transmission gate also located on the second path.

2. The LUT of claim 1, further comprising:
   a third logic gate coupled between the third transmission gate and the input terminal of the first logic gate; and
   a fourth logic gate coupled between the sixth transmission gate and the input terminal of the second logic gate.

3. The LUT of claim 2, further comprising:
   an additional memory cell having an output terminal coupled to an input terminal of the third logic gate, and further coupled to an input terminal of the fourth logic gate.

4. The LUT of claim 3, wherein the third and fourth logic gates comprise logical NAND gates.

5. The LUT of claim 1, wherein the first and second logic gates comprise logical NAND gates.

6. The LUT of claim 1, wherein:
   a first subset of the memory cells store a preselected value, the first subset of the memory cells being coupled to provide the preselected value to the first logic gate; and
   a second subset of the memory cells store the preselected value, the second subset of the memory cells being coupled to provide the preselected value to the second logic gate.

7. The LUT of claim 6, wherein the preselected value is a high value, and the first and second logic gates comprise logical NAND gates.

8. The LUT of claim 1, wherein the LUT comprises one of four, five, and six input terminals, each of the input terminals being coupled to gate terminals of a different subset of the transmission gates.

9. The LUT of claim 1, wherein each of the transmission gates comprises an N-channel transistor and a P-channel transistor, coupled in parallel and gated by complementary signals.

10. A lookup table (LUT) programmable to function as a flip-flop, the LUT comprising:
    a multiplexer circuit comprising a plurality of programmable paths therethrough, the multiplexer circuit comprising a plurality of data input terminals and an output terminal, each path extending from a corresponding data input terminal to the output terminal, wherein:
    a first subset of the programmable paths traverse a first logic gate;
    a second subset of the programmable paths traverse a second logic gate;
    a first feedback path extends from a first node on a first path in the first subset to an input terminal of the first logic gate;
    a second feedback path extends from a second node on a second path in the second subset to an input terminal of the second logic gate; and
    the first and second nodes are separated by a bidirectional gated element.

11. The LUT of claim 10, further comprising:
    a third logic gate coupled on the first feedback path between the first node and the input terminal of the first logic gate; and
    a fourth logic gate coupled on the second feedback path between the second node and the input terminal of the second logic gate.

12. The LUT of claim 11, further comprising:
    a memory cell having an output terminal coupled to an input terminal of the third logic gate, and further coupled to an input terminal of the fourth logic gate.

13. The LUT of claim 12, wherein the third and fourth logic gates comprise logical NAND gates.

14. The LUT of claim 10, wherein the first and second logic gates comprise logical NAND gates.

15. The LUT of claim 10, further comprising:
    a plurality of memory cells, each of the memory cells being coupled to a corresponding data input terminal of the multiplexer circuit.

16. The LUT of claim 15, wherein:
    a first subset of the memory cells store a preselected value, the first subset of the memory cells being coupled to provide the preselected value to the first logic gate; and
    a second subset of the memory cells store the preselected value, the second subset of the memory cells being coupled to provide the preselected value to the second logic gate.

17. The LUT of claim 16, wherein the preselected value is a high value, and the first and second logic gates comprise logical NAND gates.

18. The LUT of claim 10, wherein the bidirectional gated element comprises an N-channel transistor and a P-channel transistor, coupled in parallel and gated by complementary signals.

19. A programmable integrated circuit (IC), comprising:
    a plurality of programmable lookup tables (LUTs), each having a plurality of input terminals and an output terminal; and
    a programmable interconnect structure coupled to the input terminals and output terminals of the LUTs,
    wherein each of the LUTs comprises:
    a plurality of memory cells;
    a plurality of transmission gates coupled between the memory cells and the output terminal to form a multiplexer circuit selecting one of a plurality of values stored in the memory cells and providing the selected value to the output terminal;
    a first logic gate coupled between first and second ones of the transmission gates on a first path through the multiplexer circuit, the first logic gate further having an input terminal coupled to a third transmission gate also located on the first path; and
    a second logic gate coupled between fourth and fifth ones of the transmission gates on a second path through the multiplexer circuit, the second logic gate further having an input terminal coupled to a sixth transmission gate also located on the second path.

20. The programmable IC of claim 19, each of the LUTs further comprising:
  a third logic gate coupled between the third transmission gate and the input terminal of the first logic gate;
  a fourth logic gate coupled between the sixth transmission gate and the input terminal of the second logic gate; and
  an additional memory cell having an output terminal coupled to an input terminal of the third logic gate, and further coupled to an input terminal of the fourth logic gate.

* * * * *